United States Patent [19]
Rockett et al.

[11] Patent Number: 5,477,088
[45] Date of Patent: Dec. 19, 1995

[54] MULTI-PHASE BACK CONTACTS FOR CIS SOLAR CELLS

[76] Inventors: Angus A. Rockett, 505 Park Haven Ct., Champaign, Ill. 61820; Li-Chung Yang, 1107 W. Green St. #328, Urbana, Ill. 61801

[21] Appl. No.: 60,284

[22] Filed: May 12, 1993

[51] Int. Cl.$^6$ .......................... H01L 23/48; H01L 29/46; H01L 29/62; H01L 29/64
[52] U.S. Cl. .......................................... 257/764; 257/763
[58] Field of Search .................................. 257/764, 763, 257/762, 478, 457

[56] References Cited

U.S. PATENT DOCUMENTS

| | | | |
|---|---|---|---|
| 4,392,451 | 7/1983 | Mickelsen et al. | 118/690 |
| 4,482,780 | 11/1984 | Mitchell | 136/258 |
| 4,536,607 | 8/1985 | Wiesmann | 136/249 |
| 4,650,921 | 3/1987 | Mitchell | 136/258 |
| 4,666,569 | 5/1987 | Basol | 204/34.5 |
| 4,735,662 | 4/1988 | Szabo et al. | 136/256 |
| 4,915,745 | 4/1990 | Pollock et al. | 136/265 |
| 5,028,274 | 7/1991 | Basol et al. | 136/264 |

OTHER PUBLICATIONS

Rockett, A, Lommasson, T. C., Campos, P., Yang, L. C. and Talieh, H., Growth of CuInSe$_2$ By Two Magnetron Sputtering Techniques, Thin Solid Films, 171 (1989) 109–123.
Rockett, A., and Birmire R. W., CuInSe$_2$ for Photovoltaic Applications, J. Appl. Phys. 70 (7), 1 Oct. 1991, R81–R97.

Primary Examiner—Sara W. Crane
Assistant Examiner—S. V. Clark

[57] ABSTRACT

Multi-phase, single layer, non-interdiffusing M-Mo back contact metallized films, where M is selected from Cu, Ga, or mixtures thereof, for CIS cells are deposited by a sputtering process on suitable substrates, preferably glass or alumina, to prevent delamination of the CIS from the back contact layer. Typical CIS compositions include CuXSe$_2$ where X is In or/and Ga. The multi-phase mixture is deposited on the substrate in a manner to provide a columnar microstructure, with micro-vein Cu or/and Ga regions which partially or fully vertically penetrate the entire back contact layer. The CIS semiconductor layer is then deposited by hybrid sputtering and evaporation process. The Cu/Ga-Mo deposition is controlled to produce the single layer two-phase columnar morphology with controllable Cu or Ga vein size less than about 0.01 microns in width. During the subsequent deposition of the CIS layer, the columnar Cu/Ga regions within the molybdenum of the Cu/Ga-Mo back layer tend to partially leach out, and are replaced by columns of CIS. Narrower Cu and/or Ga regions, and those with fewer inner connections between regions, leach out more slowly during the subsequent CIS deposition. This gives a good mechanical and electrical interlock of the CIS layer into the Cu/Ga-Mo back layer. Solar cells employing In-rich CIS semiconductors bonded to the multi-phase columnar microstructure back layer of this invention exhibit vastly improved photo-electrical conversion on the order of 17% greater than Mo alone, improved uniformity of output across the face of the cell, and greater Fill Factor.

11 Claims, 6 Drawing Sheets

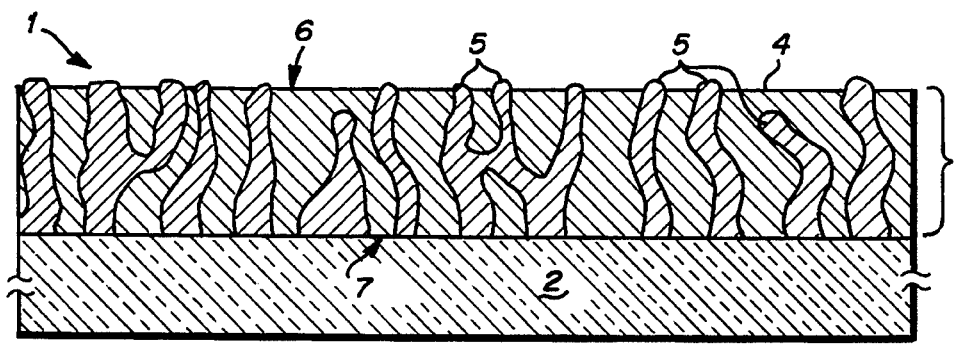
Fig_1
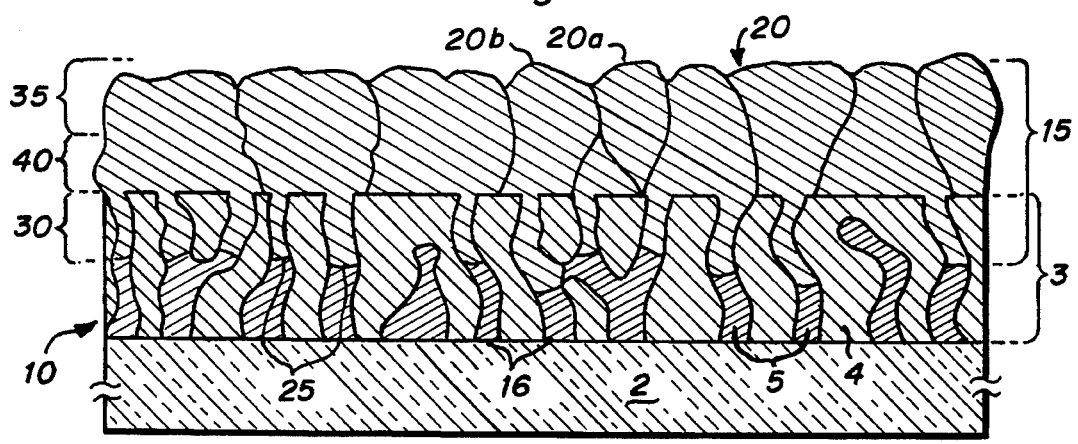
Fig_2
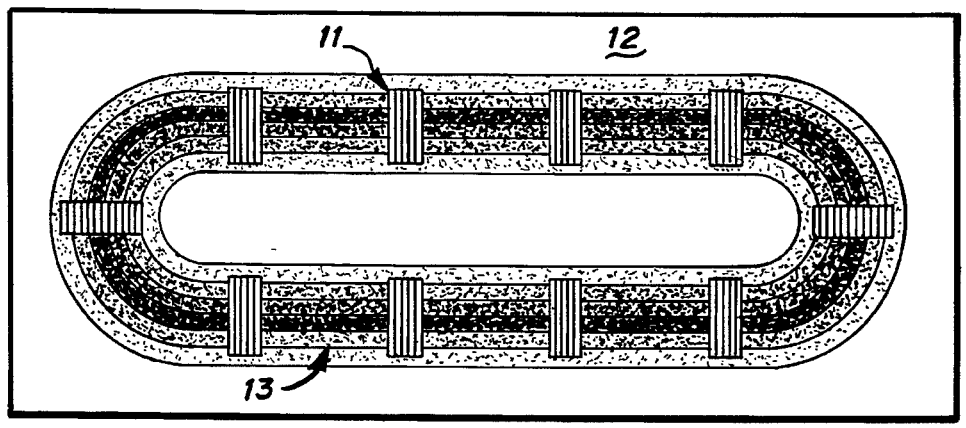
Fig_3

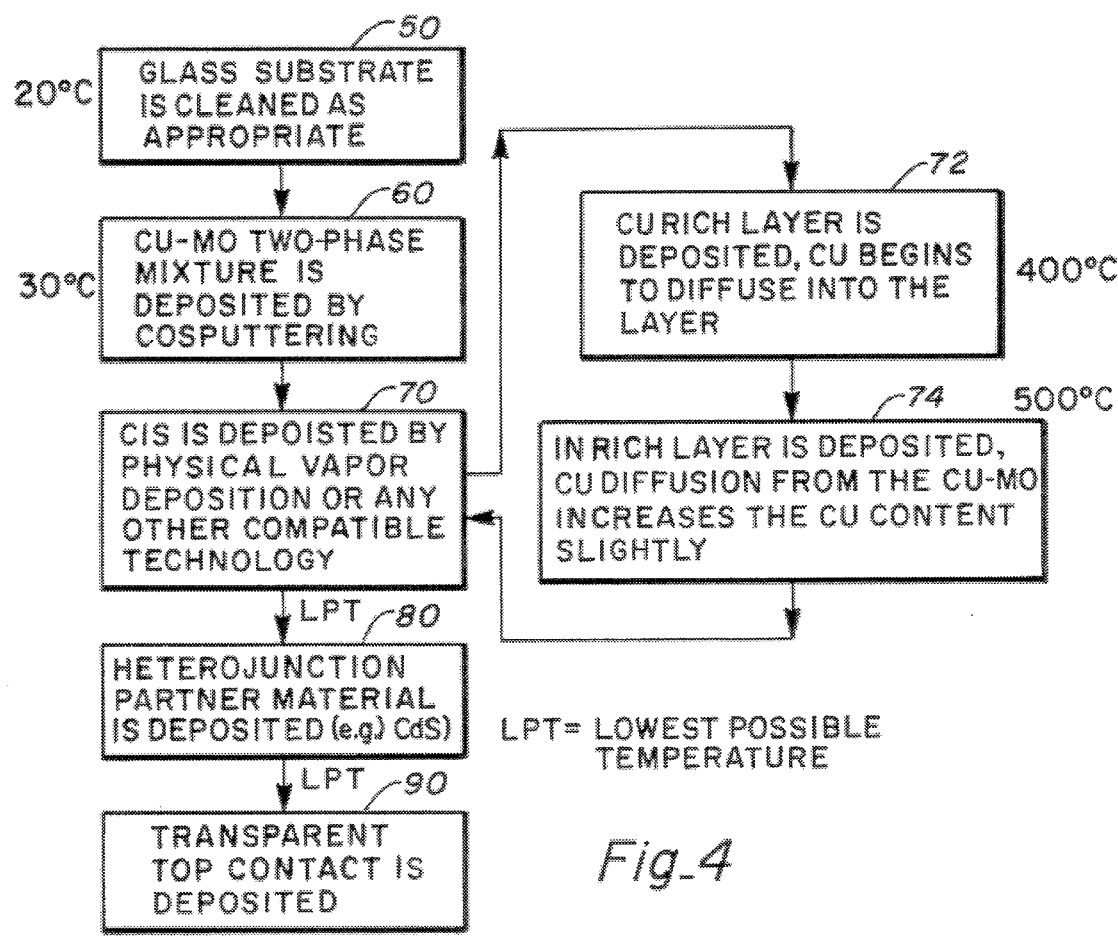
Fig_4
LPT = LOWEST POSSIBLE TEMPERATURE
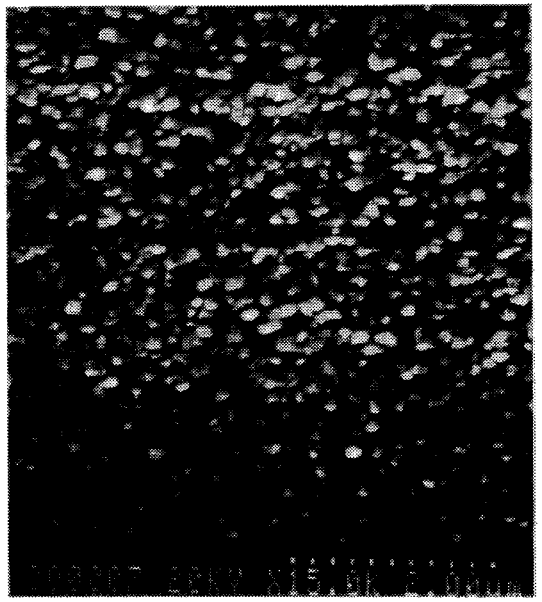
Fig_5
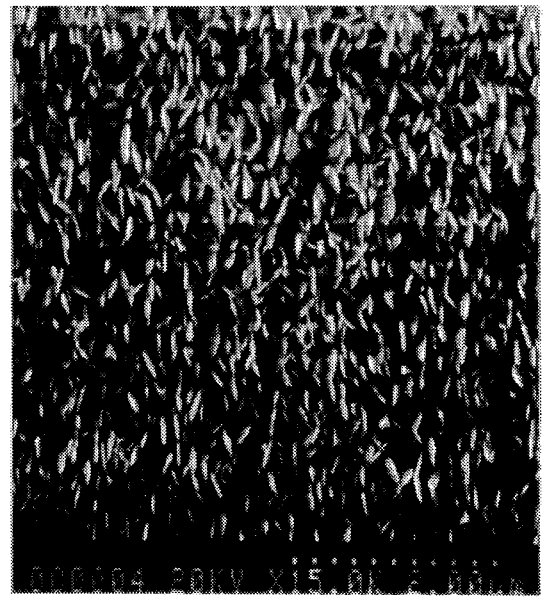
Fig_6

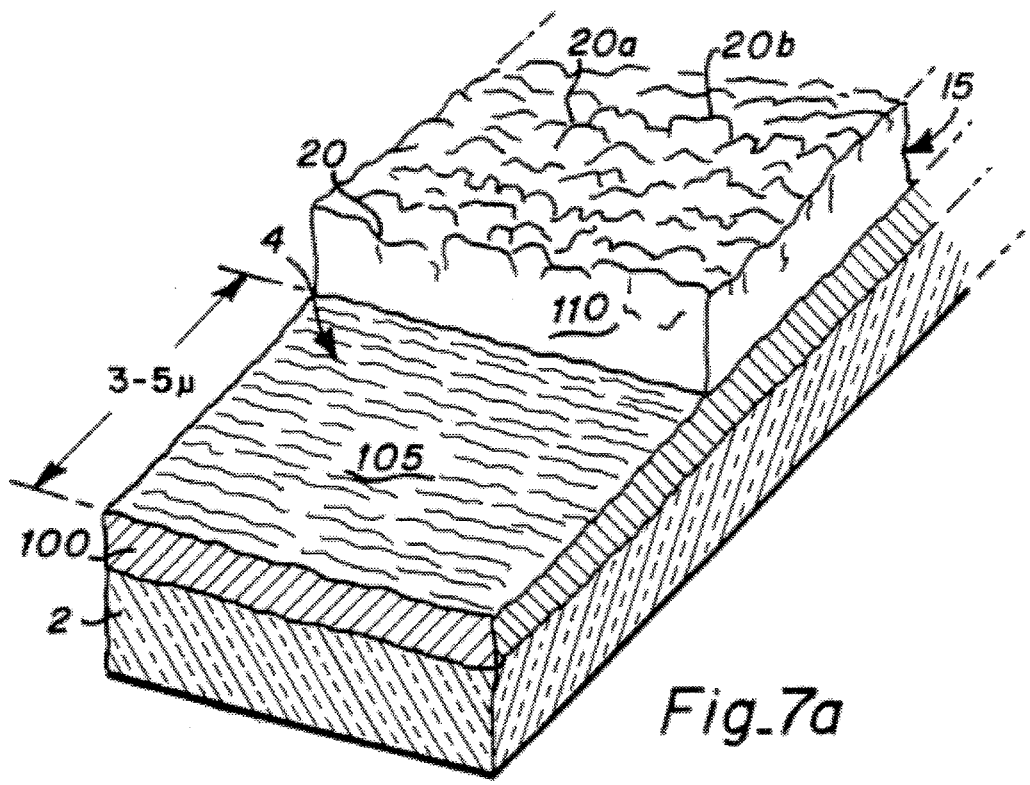
Fig._7a
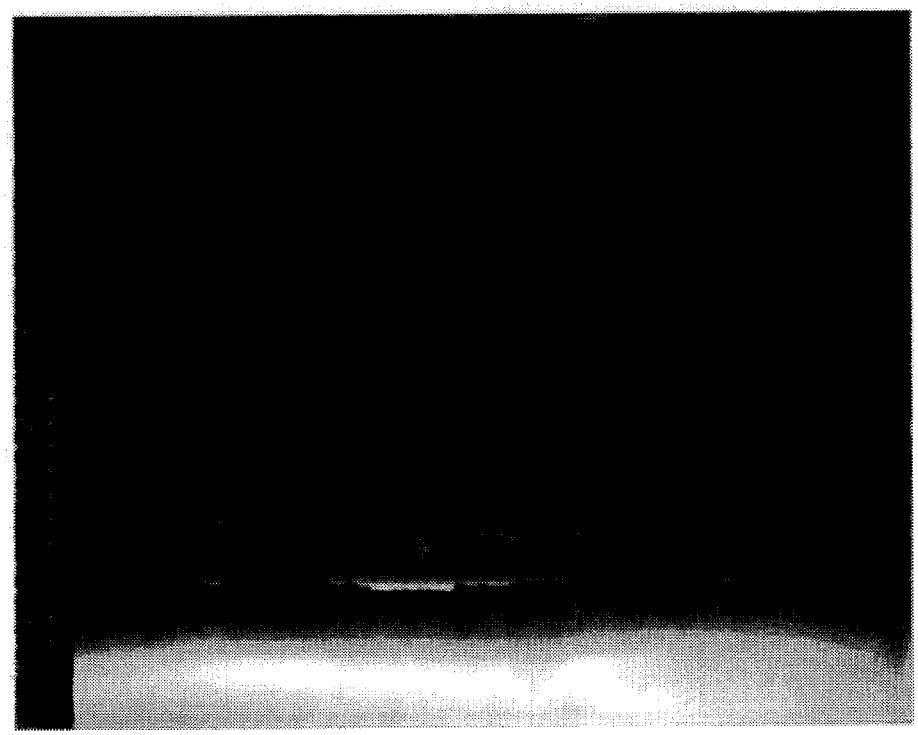
Fig._7b

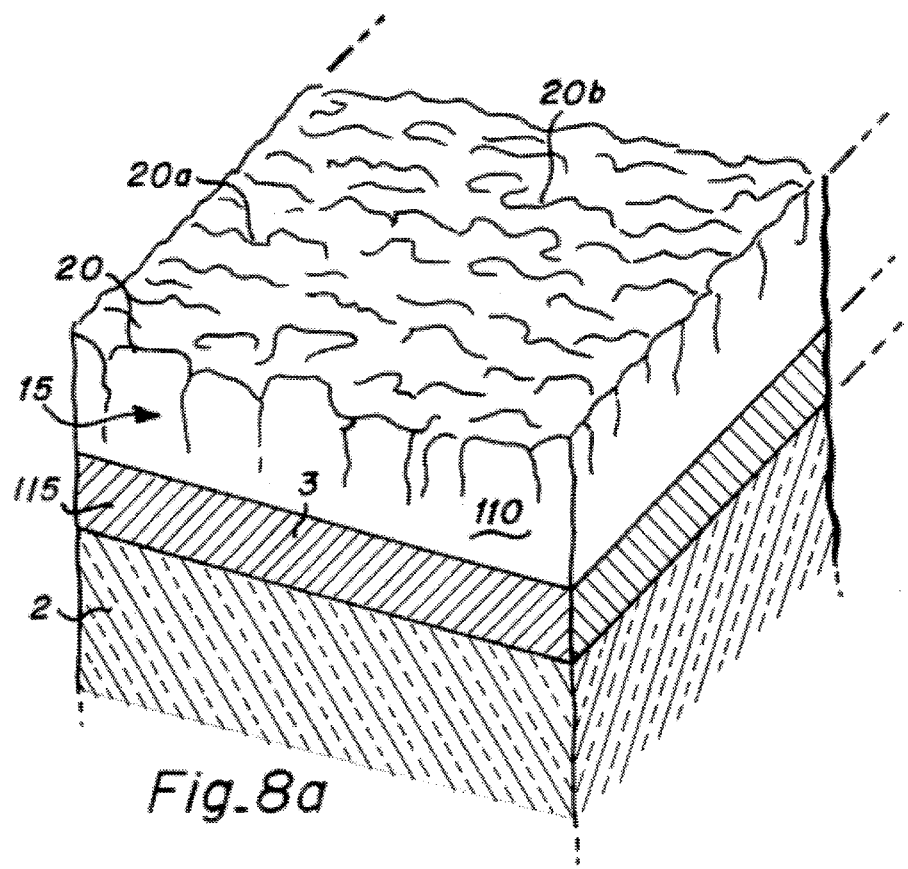
Fig_8a
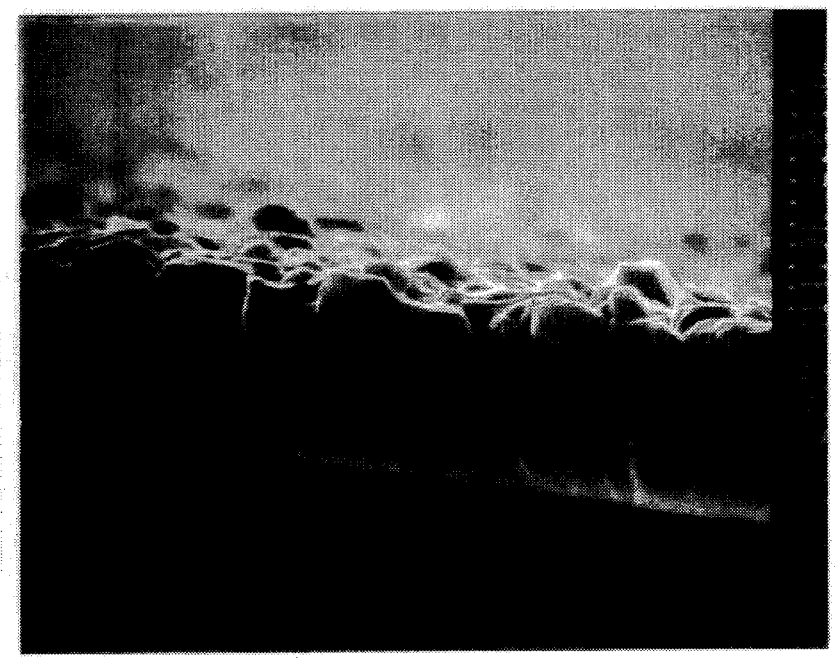
Fig_8b

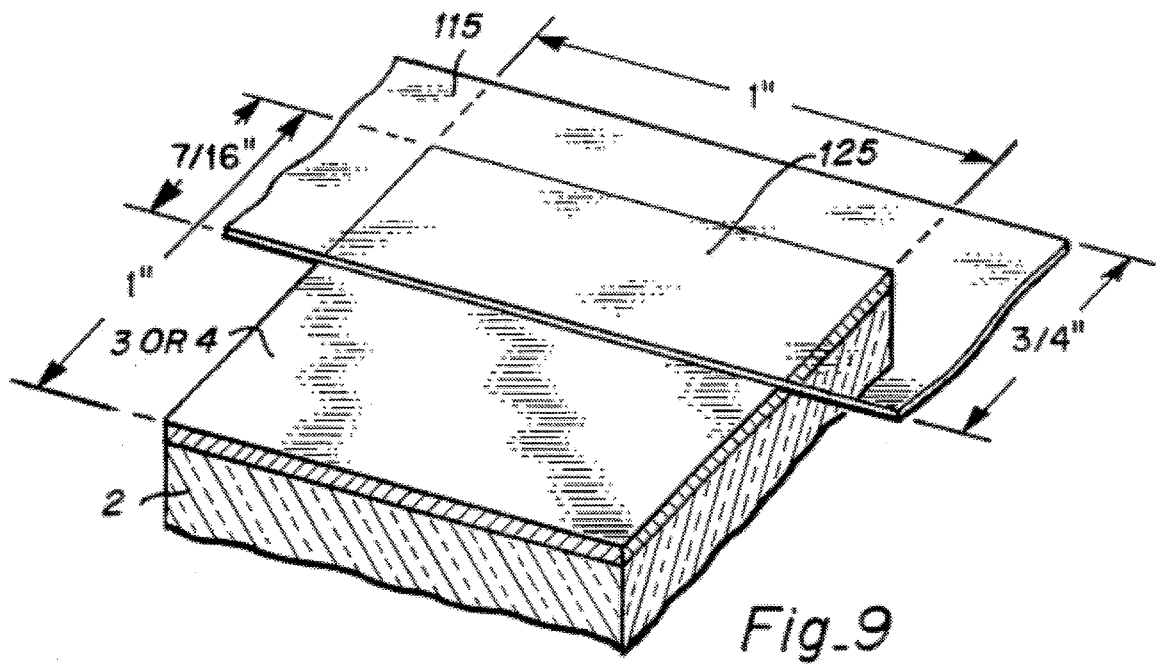
Fig_9
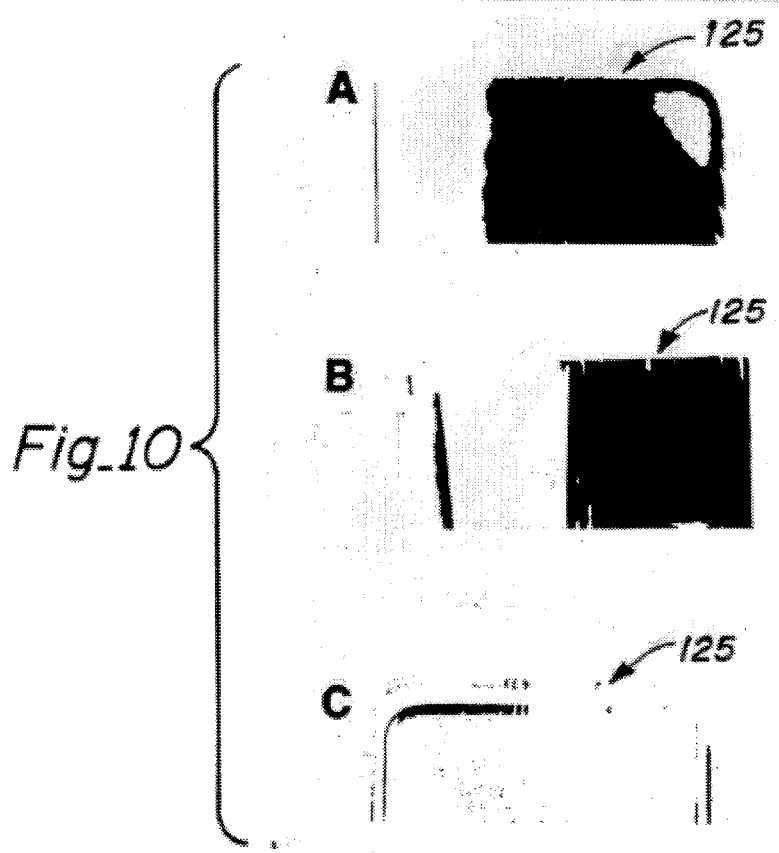
Fig_10

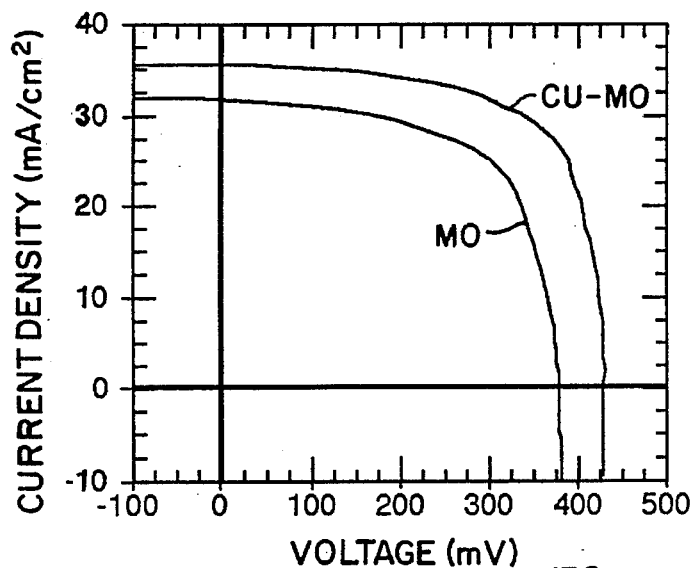
Fig._11
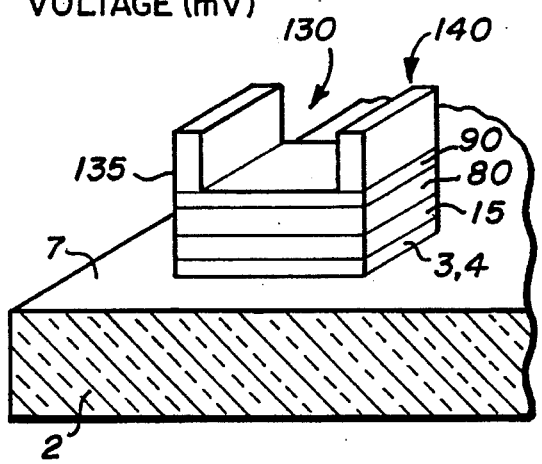
Fig._13
Uniformity on a 1x1 sample:
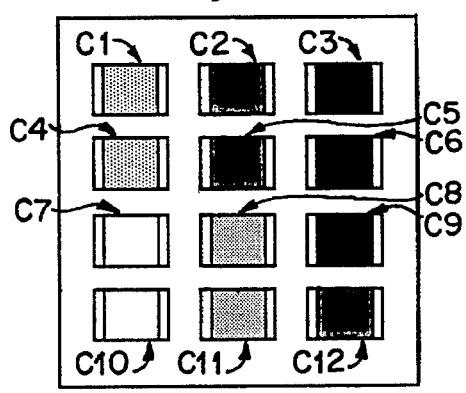
DEVICES ON PURE MO
Fig._12a
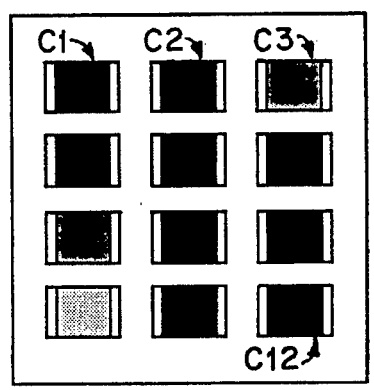
DEVICES ON CU-MO
Fig._12b
LEGEND:
■ 100%
■ 85-99
■ 70-84
■ 45-69
▨ 30-44
▨ 15-29
□ <15
Fig._12

5,477,088

MULTI-PHASE BACK CONTACTS FOR CIS SOLAR CELLS

NOTICE OF GOVERNMENT RIGHTS

This invention was made with Government support under SERI Subcontract No. XC-0-10017-1 under contract No. DE-AC02-83-83CH10093 between National Renewable Energy Laboratory and the Department of Energy. The Government has certain rights in this invention.

FIELD

This application relates to use of single layer, multi-phase, non-interdiffusing mixtures of Mo and a metal, M, selected from Cu, Ga and mixtures thereof, as an adhesion-promoting, electrically conductive back contact (metallization) layer for semiconductors, and particularly for $CuXSe_2$, where X is In and/or Ga, (herein CIS), and related Cu-containing semiconductor compounds used in solar cells. The multi-phase back layers of this invention provide excellent adhesion to substrate materials such as silica or alumina containing substrates, as well as improved bonding to the overlying semiconductor compositions which are deposited thereon. Both good electrical and mechanical adhesive properties are obtained by the use of the multi-phase back contact layers in accordance with the sputtering and vapor deposition processes of the invention.

BACKGROUND

An important polycrystalline solar cell technology employs copper-compound semiconductors, such as copper indium diselenide, $CuInSe_2$, called CIS, to convert solar energy into electricity or for use as a photocopy drum photosensitive surface. These CIS semiconductors are preferably bonded to a glass or alumina substrate. While CIS bonds acceptably to glass, direct CIS bonding to glass does not form a useful device because of the resistance of the CIS. Hence, some form of electrically conductive material is required on the back of the CIS semiconductor layer, which back layer in turn adheres to the substrate.

It is essential that back contact layers are inert with respect to the CIS semiconductor or at least not detrimental to the CIS if interdiffusion occurs. Group IB and IIIA metals such as Cu and Al diffuse into the layer and affect the CIS composition. Transition metals diffuse into the CIS layer during deposition. Even in very small quantities these are detrimental because they are understood to be deep traps in CIS which prevent photovoltaic behavior. Mo, the currently preferred back layer, has the advantage that it is almost completely inert with respect to Cu and In, and converts to Mo-selenides sufficiently slowly that the resulting presence of $MoSe_2$ is not a major problem.

All of the commercial research and development work concerned with CIS solar cells is currently based on Mo back contacts. However, it is the inertness of Mo that allows adhesion failures, resulting in failure of the cells at the CIS/Mo interface. This failure is particularly common for In-rich CIS, whether slightly or more Indium-rich, which is the optimum composition for making photovoltaic devices as they currently have the best properties for conversion of sunlight to electricity. Mo is highly susceptible to accumulation of residual stresses during deposition as a thin film, which exacerbates delamination failure. Mo is also thought to result in a low-barrier Schottky contact to CIS which is not optimal.

Other back contact metals proposed to date in the art include aluminum, iron, nickel, chromium and pure copper. But these metals result in various chemical reactions and degradation of the CIS. That is, under the thermal deposition conditions those metals may chemically react with the CIS constituents, or diffuse into the relatively thin CIS layer. This results in degradation of the photo-electric conversion properties of the semiconductor.

Exemplary prior art showing a variety of approaches to back layer construction include MICKELSEN U.S. Pat. No. 4,392,451 (Boeing), which in FIG. 2 teaches a sputtered-on Mo base contact layer 32 on an alumina substrate 31 for a p-n type heterojunction solar cell which is vacuum deposited in a "composition-graded" manner. That is, there is a gradient in the overlying vacuum-deposited photovoltaic active materials starting with a low resistivity p-type semiconductor (shown in FIG. 4 as a Cu-enriched CIS), followed by a transient n-type semiconductor material (shown in FIG. 4 as a Cu-deficient CIS), together defining a transient p-n junction, followed by a low resistivity n-type semiconductor (CdS). The upper portion of the Cd/S is Indium-doped for superposition thereon of grid contacts 38 and an antireflective layer 40.

Regarding the base contact layer on the alumina substrate, MICKELSEN suggests in Col. 10, lines 9–12 that Mo/Au "could be used and, perhaps, other materials such as conventional nickel and graphite materials which have been commonly employed in conventional solar cells." Such multi-layer structures are commonly considered. However, Au has turned out to be unusable as a back contact constituent since it diffuses rapidly and damages photovoltaic performance if it enters the device layer, i.e., the semiconductor layer.

This MICKELSEN patent is old technology. In its day, over a decade ago, it may have been an improvement over the then-available CdS/CIS heterojunction solar cells. The focus is not on the base contact 32 (compare Prior Art FIG. 3 with the MICKELSEN invention FIG. 4). Rather, the idea was to form a gradient of the amount of Cu in the CIS layer from Cu-enriched adjacent the base contact Mo layer to Cu-deficient for contact with the CdS at the other surface, the top of which is In-doped. The interdiffusion between the discrete juxtaposed regions 35a, 35b of the CIS layer is said to define a transient p-n homojunction. However, the Cu-rich/In-rich bilayer device structure has been shown to be transient. SIMS analyses of such bilayers have shown that they consistently intermix during deposition leaving a uniform composition CIS layer behind. The Cu-rich material results from changes in the flux of atoms arriving from the vapor phase and not from the substrate metallization.

The MICKELSEN patent does not recognize or address the problems of delamination at the CIS/Mo interface.

A patent that does address the delamination problem is the 1990 POLLOCK et al. U.S. Pat. No. of ARCO, 4,915,745. Pollock et al. use a multi-layer structure consisting of a Mo back contact 12 on a glass substrate 10, with a Ga interlayer 13 between the CIS 24, 26 and the Mo back contact. The CIS is made by depositing a Cu layer 24 on the Ga, and then an In film 26, thereover. They are heated in the presence of Se to form CIS. The minimum thickness of Ga is 50 Angstroms. The resulting bond is said to prevent peeling, wrinkling and related problems. In Col. 5, lines 37–54, it states that Auger analysis was then performed to locate the various elements. Low concentrations (below detectable with Auger analysis) of Ga may be present in the CIS; Auger showed Ga only adjacent the Mo. Cu, In and Se had interdiffused to form a 2 micron CIS layer. Some Cu, In and Se were detected in the region "adjacent to the Mo" and "Se in a portion of the Mo film adjacent to the CIS film" (Col. 5, lines 45–48). However, there is clear evidence for Ga in the CIS layer from AES data, and a definite sensitization of the Mo layer results.

WIESMANN, in his 1985 U.S. Pat. No. 4,536,607, shows in FIG. 2 CIS 26 bonded to a glass substrate 24 via a ½ micron thick Mo interlayer 26 (Col. 8, 1.51–56), which acts as an electrical contact layer in an amorphous Si/CdS-$Cu_2S$ heterojunction tandem photovoltaic cell. In FIG. 1, where 20 is CIS, 21 is Mo. This Wissmann patent teaches in Col. 6, lines 59–66 that the electrical contact layer 21 in FIG. 1 "may be a metal such as Mo, Ag, Au, Cu, Cr or the like, alone or in a mixture." In FIG. 1 the electrical contact layer is not a bonding layer. As to FIG. 2, Col. 7, lines 5–9, teach the metal layer 25 can be "a thin metallic layer" on an insulator 24 (see Col. 8, 1.51–56). There is no teaching of a mixture of Mo and Cu as a two-phase columnar layer for improved CIS-to-substrate bonding.

The remaining patents are of less pertinence: BASOL et al, in the 1987 International Standard Oil/BP Solar Ltd., U.S. Pat. No. 4,666,569 teaches a two-layer ohmic contact as a current collector (layers 14, 15 in FIG. 1) on a p-type semiconductor. Layer 13 is a CdTe semiconductor which is acid etched. Less than 50 Angstroms of Cu is deposited thereon to form layer 14. Layer 15 may be Mo, Ni or other metals, mixtures, and alloys (Col. 3, lines 52–55), but not Cu. Ni is preferred for contact layer 15, Cu for layer 14 with the Ni layer being greater than 1000 Angstroms thick. Col. 3, lines 60–65 indicates Mo cannot be substituted for the Cu layer 14. The Cu diffuses into the player (CdTe layer 13), Col. 4, lines 9–18, but Cu can not be used for layer 15 because then Cu will diffuse all the way through the CdTe layer and cause a short with the n-type CdS layer. Incidentally, InSn is used as the layer 11 to bond the CdS/Cd Te p-n layers 12, 13 to the glass substrate 10.

The BASOL et al., 1991 U.S. Pat. No. 5,028,274 of International Solar Electric Technology Inc. teaches using an intermediate layer of Te, Se, Sn or Pb between the surface of CIS 12 and a back layer 11 of Mo for bonding the CIS to the Mo. The Mo layer 11 is deposited on a glass substrate. Thus, this patent, like POLLOCK U.S. Pat. No. 4,915,745 teaches an intermediate layer, or modifying the Mo contact surface with another metal (Ga in Pollock, Te in Basol 274).

The MITCHELL 1987 U.S. Pat. No. 4,650,921 of Arco uses a tin oxide ($SnO_2$) layer 14 on glass substrate 12 to bond to a CdTe semiconductor film. A Te-rich PbTe layer 18 is used to bond that CdTe film to a top, metal conductor layer 20, which may be Ni, Al, Au, Solder (Pb) and graphite-copper, with C-Ag being preferred.

The earlier 1984 MITCHELL U.S. Pat. No. 4,482,780 of D.O.E. shows use of an In or Sn layer 12 to bond CIS semiconductor layer 13 to glass. See Col. 5, lines 1 and 2. The CIS semiconductor is overlain with a CdS layer, Col. 6, lines 28–32.

The SZABO et al., 1978 Standard Oil U.S. Pat. No. 4,735,662 uses a 3-layer ohmic contact on top of a CdTe/Cds semiconductor (layers 9, 7 in FIG. 1). Cu is used as a 2 nm thick contact-forming layer 13 deposited on the CdTe. Then an isolation layer of C or Ni (layer 15) is used intermediate the Cu and the electrical conductor 19 connection layer 17, which is made of Cu covered by Ag, Al, or Ni, preferably Al. To bond the Cds to a glass substrate 3, an $InSnO_2$ layer is used.

Accordingly, there is a need in the art to improve the mechanical and interlock between the back layer and semiconductor layer compositions while keeping excellent ohmic contact, in order to prevent photovoltaic cell failure due to delamination under operating conditions, thereby improving the useful life of solar cells and prevent electrical output drop-off due to back layer bonding failure.

THE INVENTION

OBJECTS

It is among the objects of this invention to provide improved solar cells that have greater photovoltaic conversion efficiency, greater fill factor, better uniformity, longer useful life, and more consistent electrical output through the use of multi-phase M-Mo back contact layers, where M is a metal selected from Cu, Ga and mixtures thereof.

It is another object of this invention to provide improved photovoltaic cells employing copper-type semiconductor compositions, particularly CIS compositions of $CuXSe_2$ where X is Cu or/and Ga, which employ a single layer back contact of a multi-phase, non-interdiffusing M-Mo composition, exhibiting what is believed to be a columnar microstructure, having improved mechanical interlock adhesion and electrical properties.

Another object of this invention to provide a process for deposition of a multi-phase M-Mo composition on a substrate in a columnar microstructure form which promotes excellent adhesion to semiconductor overlayers and improves the lifetime electrical characteristics through reduced delamination.

Still other objects of the invention will be evident from the description, drawings and claims of the invention which follow.

A BRIEF DESCRIPTION OF THE DRAWINGS

The invention is illustrated in the accompanying drawings, in which:

FIG. 1 is a vertical section view through a prepared substrate of this invention showing schematically the structure of the M-Mo multi-phase back contact bonding layer after sputtering deposition onto a substrate;

FIG. 2 is a vertical section view of a semiconductor device in accordance with this invention showing schematically the sputtering/evaporative deposition of a semiconductive layer, here CIS, with the CIS replacing a portion of the Cu/Ga in the channels of the M-Mo multi-phase bonding layer to form a good mechanical interlock;

FIG. 3 is a schematic plan view of a magnetron sputtering Cu-Mo target to produce the M-Mo back contact metallization film layer of the invention;

FIG. 4 is a schematic flow sheet of methods for deposition of a multi-phase back layer of this invention followed by deposition of CIS device layer(s) heterojunction layer(s), and transparent protective layer(s);

FIG. 5 is a Scanning Electron Micrograph (SEM) of the surface of a Mo back contact film;

FIG. 6 is a SEM of the surface of a Cu-Mo two-phase film of this invention;

FIG. 7 is a SEM fracture cross-section of a Mo back contact film with FIG. 7A being a schematic perspective orientation view of what is seen in the SEM of FIG. 7B;

FIG. 8 is a SEM fracture cross-section of a Cu-Mo two-phase back contact film of this invention with FIG. 8A being a schematic perspective orientation view of the SEM of FIG. 8B;

FIG. 9 is an isometric view of the adhesion test set up;

FIG. 10 is a photograph of three comparison adhesion tests, FIG. 10A being pure Mo on borosilicate glass, FIG. 10B being pure Mo on soda-lime glass, and FIG. 10C being a Cu-Mo two-phase film of this invention on soda lime glass;

FIG. 11 is a graph of the comparative improvement in fill factor expressed as current density vs. voltage outputs of a prior art Mo back contact layer cell and a Cu-Mo back contact layer cell of this invention;

FIG. 12 is a diagram showing improvement in output uniformity of Cu-Mo cells of this invention, FIG. 12B, as compared to prior art Mo cells, FIG. 12A; and FIG. 13 is a schematic isometric of one test cell of FIG. 12 on a substrate.

SUMMARY

The invention relates to single layer multi-phase M-Mo, back contact films for photovoltaic solar cells employing semiconductor collector/converter device layer(s) on substrates wherein M is a metal selected from the group consisting essentially of Cu, Ga and two-phase mixtures thereof. While we do not wish to be bound by theory, the Cu-Mo, Ga-Mo, or Cu-Ga-Mo layer is characterized by columnar microstructure of molybdenum with interstitial microchannel gaps filled with M-metal (Cu, Ga or two-phase Cu and Ga) as seen in vertical cross-section, with the M-metal microchannel regions partially or fully penetrating the Mo contact layer.

While the discussion herein refers principally to Cu-Mo, as two-phase structures, it should be understood that such reference is meant to include, in place of or in addition to Cu, Gallium to form Ga-Mo two-phase or Cu-Ga-Mo three-phase structures of the same type, and reference to Cu includes Ga in place of part or all of the Cu as the M-metal. Ga is only slightly soluble in Cu, and the reference herein to Cu-Ga as a two-phase system or mixture also includes some of the Ga dissolved in the Cu as well as Cu and Ga in distinct phases. The convention "Cu/Ga-Mo" as used herein means the two- or three-phase systems Cu-Mo, Ga-Mo, Cu-Ga-Mo in a single layer microcrystalline columnar structure with the microchannels or interstices filled with the M-metal (Cu, Ga or Cu-Ga) phase(s).

The Cu/Ga-Mo back contact film layer may conveniently be applied to the substrate, typically glass or alumina, by simultaneous deposition at low temperature, e.g., by a magnetron sputtering process. To achieve small grain size, the deposition temperature is kept low enough to prevent significant diffusion of the Cu and/or Ga M-metal, and take advantage of the refractory nature of the Mo. The cathode material is preferably a finely divided mixture of M-metal (copper and/or gallium) and molybdenum, e.g., a powder metallurgy Cu/Ga-Mo target. Alternately, Cu/Ga and/or Ga/Mo foil may be soldered with In to a Mo target. A third method is simultaneous sputtering of two or three targets: one of Mo, and one of Cu or Ga; or one of Mo, one of Cu, and one of Ga, at different currents.

The amount of M-metal Cu or Ga in the Cu-Mo (Ga-Mo) back contact film layer ranges from about 15 to about 50 atom percent, with the preferred range being 25–35 atom percent. The Ga can substitute for from 0 to 100% of the Cu. Significant adhesion improvement is evident at 30 atom percent Cu and/or Ga.

The deposition process is controlled to produce the columnar morphology with a preselected Cu and/or Ga one or two-phase microchannel region width as small as possible, typically on the order of 0.01 micron, 100Å, preferably in the range of from about 10Å to 1000Å. Thereafter, the semiconductor, typically a copper-type semiconductor, such as $CuXSe_2$, wherein X is In and/or Ga, such as $CuInSe_2$ or $CuInGaSe_2$ (herein CIS), is applied by a hybrid sputtering and evaporation process. While the M-metal Cu/Ga in the back contact layer film is not volatile at these temperatures during the application of the CIS semiconductor layer, some of the Cu and/or Ga in the interstitial microchannel gaps effectively dissolves or leaches into the In-rich CIS material, or forms selenides of locally Cu/Ga-rich composition. Because of the M-metal Cu/Ga dissolution from the microchannels into the overlying CIS, the CIS is effectively deposited into the interstitial channels in the back contact film layer to provide a strong mechanical and electrical bond. By "leaching" is meant solid-state diffusion during deposition of the CIS layer. Cu/Ga from the microchannels in the back contact layer is gradually and preferably incompletely dissolved by the CIS layer during CIS deposition. Narrower Cu/Ga regions (interstitial channels), and regions which interconnect less, inter-dissolve more slowly during CIS deposition. Concentration gradients are easier to maintain if the Cu/Ga channels are narrower.

The Cu/Ga-Mo back layer films of this invention are particularly useable with Indium-rich $CuInSe_2$ or $CuInGaSe_2$ (CIS) semiconductors. The CIS layer can be applied by gradient sputtering/evaporative techniques to provide a copper-rich interface with the Cu/Ga-Mo back layer, gradually converting to an Indium-rich exterior surface by control of the sputtering conditions, and/or by control of the ratio of the CIS components at the cathode during the sputtering/evaporation semiconductor layer deposition process. The result is that the In-rich composition is maintained while forming a vastly improved bond to the back contact layer on the substrate. A narrow Cu/Ga-rich region in the CIS layer is preferred, if far from the heterojunction, since the Cu/Ga-rich region is more heavily p-type and may raise the device output voltage. The combination of controlled Cu/Ga grain size and interconnection channel width in the back contact layer, and CIS layer deposition process conditions leads to slow enough leaching to maintain the CIS very near the back contact in a preferred Cu/Ga-rich form, without significantly increasing the Cu/Ga content of the overall film.

A semiconductor device is completed by subsequent application in a conventional manner of a heterojunction material layer, such as CdS, followed by a protective transparent top layer, such as ZnO. Both may be applied at low temperature by sputtering or evaporative deposition processes. Incorporated by reference herein for further details of deposition processes are two papers by us: Rockett, A., Lommasson, T. C., Campos, P., Yang, L. C., and Talieh, H., Growth of $CuInSe_2$ By Two Magnetron Sputtering Techniques, Thin Solid Films 171 (1989) 109–123; and Rockett, A., and Birkmire, R. W., $CuInSe_2$ for Photovoltaic Applications, J.Appl. Phys., 70(7), 1 October 1991.

The resultant back layer provides greatly improved mechanical interlock adhesion of the CIS layer to the substrate. Because the resulting solar cell of this invention has reduced delamination, the electrical output of the solar cell is significantly improved over its lifetime. The electrical output shows less drop-off as the solar cell ages under use conditions due to the fact that there is reduced degradation of output from delamination effects. In addition, test results surprisingly show a 17% increase in electrical output, measured as photovoltaic conversion efficiency. Experimental results have shown significant improvements in adhesion using CIS deposited by the hybrid sputtering and evaporation process without leaching all of the Cu/Ga out of the back contact film layer of the prepared substrate. Adhesion is improved by strong mechanical interlocking between the back contact and semiconductor film. Thermal and electrical conductivities of the back contact increase with the presence of Cu/Ga. Ductile Cu/Ga interstitial inclusions reduce residual stress in the contact layer by plastic deformation. The Cu/Ga-rich CIS near the interface is strongly p-type leading to good ohmic contact.

Thus, in its broadest aspect, this application is directed to the invention of preparation and use of a multi-phase adhesion layer employing diffusion bonding, i.e., interdissolution or leaching of one or more of the phases into a compatible overlayer, as an intermediate layer for adhesion control in a wide variety of areas, both electronic and non-electronic. The M-Mo (Cu-Mo, Ga-Mo, and Cu-Ga-Mo) films disclosed are specific examples of a back contact layer for photovoltaic cells, particularly CIS cells of $CuXSe_2$ where X is In and/or Ga.

DETAILED DESCRIPTION OF THE BEST MODE

The following detailed description illustrates the invention by way of example, not by way of limitation of the principles of the invention. This description will clearly enable one skilled in the art to make and use the invention, and describes several embodiments, adaptations, variations, alternatives and uses of the invention, including what we presently believe is the best mode of carrying out the invention.

FIG. 1 shows in schematic vertical cross-section a highly magnified view of a prepared substrate assembly 1 comprising a single layer, multi-phase, non-interdiffusing Cu/Ga-Mo back contact metallization layer 3 adhered to a substrate 2, such as $SiO_2$ (glass) or $Al_2O_3$ (alumina) containing substrate material. Mo regions 4 are interspersed with thin microchannels 5 of Cu or Ga 5. They can also be characterized as Cu- or Ga-filled gaps or channels 5. The Cu/Ga regions may interconnect as shown, and some may not reach the surface 6 of the back contact layer, or conversely, starting at the top of the back contact surface 6, the Cu/Ga channels may not reach down to the top surface 7 of the substrate 2.

FIG. 2 shows the projected morphology of a semiconductor device 10 after deposition of the CIS In-rich layer 15 onto the back contact layer 3. The zone 30 represents interdiffusion of the Cu/Ga of the back contact layer into and with the CIS, providing excellent mechanical interlock of the CIS into and around the Mo granules 4. This zone may be locally Cu/Ga-rich. The upper zone 35 of the CIS layer remains In-rich. An intermediate layer 40, may or may not be present depending on the amount and extent of diffusion of the Cu and/or Ga into the CIS. The non-leached Cu/Ga extending to the substrate surface is identified as 16. The individual crystals of the polycrystalline CIS 20 are represented as 20a, 20b, etc.

EXAMPLES 1 AND 2

Deposition of Cu-Mo Back Contact Film

Two-phase Cu-Mo back contact metallization layers for $CuInSe_2$ (CIS) solar cells have been produced by magnetron sputtering of composite targets, shown in FIG. 3. For flexibility in development of the back contact layer, pieces of Cu foil 11 were soldered to a 5"×12" Mo target 12 using In solder. Two target compositions were tested using different sizes of 1" long Cu strips, either 0.4" wide or 0.6" wide. The strips straddled the "racetrack" region 13 of the target where sputtering was strong. The objective of the change in strip width was to adjust the Cu content, in atom percent, in the deposited film. Indium solder was used because unintentional incorporation of In into the contact metallization would not degrade the CIS layer deposited subsequently.

Four 1"×1" Corning 7059 borosilicate or common soda-lime slide-glass substrates were loaded opposite the center of the target separated from each other by 0.25", and placed at a distance of 3" (7.6 cm) from the face of the target. Deposition conditions were as follows: The sputtering gas was ultrahigh purity Ar at a pressure of 4 mTorr. The sputtering voltage ranged from 310 to 330 V at a current of 1A. The substrates were unheated, with a resulting deposition temperature of 25°–35° C. The deposition time was 10 to 30 minutes with film thicknesses of 0.5 to 1.5 microns. The resulting deposition rate was 50 nm/min.

Ga/Mo or Cu/Ga strips can be substituted for some or all of the Cu strips to produce two-phase Ga-Mo or three-phase Cu-Ga-Mo films, respectively.

In the magnetron sputtering, the ultimate composition of the back contact Cu/Ga-Mo film is related to the fractional area of the target occupied by each material and to the ratio of the sputtering yields of the target (for the target structure shown in FIG. 3). The target area ratios and corresponding film compositions are shown in the following table:

TABLE 1

|  | Cu Area Fraction | Cu—Mo Back Contact Film Cu Atom Fraction |
|---|---|---|
| Target 1 (Ex. 1) | 0.32 | 0.22 |
| Target 2 (Ex. 2) | 0.46 | 0.30 |

The deposited Cu-Mo films were analyzed by scanning electron microscopy (SEM) for surface structure, energy-dispersive fluorescent X-ray analysis (EDX) for chemical composition, and had CIS layers deposited on top of the Cu-Mo films for adhesion testing. Adhesion was studied by tape tests and analysis of device failures (Examples below).

FIG. 5 is a SEM photo of the surface of a pure Mo film produced by the process of Example 1 but without use of Cu/Ga or Ga/Mo foil strips on the magnetron raceway. FIG. 6 is a comparative SEM photo of the surface of a typical Cu-Mo film of Example 1 or 2. Both photos are 15,000 magnification and the spaced square-dot scale (10 dots) just above the legend at the bottom of the photos is one micron, each space between dots (starting with zero) representing 0.1μ.

FIGS. 7 and 8 show the striking difference in adhesion of a CIS layer to Mo film (FIGS. 7A, 7B) and to a Cu-Mo film of this invention (FIGS. 8A, 8B). FIG. 7A is an isometric schematic drawing of what is seen in the SEM photo of FIG. 7B. A CIS layer is deposited by the process of FIG. 4 on a Mo back layer; see the incorporated Rockett et al articles for typical process details. The film is then fractured by scoring the back of the glass substrate and breaking the prepared substrate assembly (Mo-CIS layered glass). The Mo layer 2 forms a fracture edge 100 along the score. The CIS layer 15, however, does not fracture at the same place. Rather, a step-back region 105 of the Mo layer is exposed, showing delamination in the entire region 105. The fracture face 110 of the CIS is stepped back on average about 3–5 microns, the distance between Mo fracture face 100 and CIS fracture face 110. The smoothness of the exposed top surface 4 of the Mo is indicative of a mechanically poor surface to which the CIS has difficulty in adhering, even though the grain boundaries of the Mo layer are evident in the photo FIG. 7B. The substrate is in the foreground when the photo is viewed with the scale on the left. The photo is taken from approximately a 30°–45° inclination down from vertical so the photo shows the isometric view across the peeled back zone 105. The individual CIS domains 20 are clearly visible like blocks of ice, at the base of which is a dark shadow zone. Magnification is 10,000×.

In contrast, FIGS. 8A and 8B show the Cu-Mo single layer back contact film of this invention with a CIS layer after scoring fracture of the glass substrate. The fracture face 115 of the Cu-Mo is parallel and vertically coordinate with the fracture face 110 of the CIS, i.e., the two fracture faces are substantially in the same plane. The lack of a peel-back area means the CIS is strongly bonded to the Cu-Mo layer. As before, the CIS microcrystal domains 20, 20a, 20b are clearly visible. The magnification is 14,900×, as it was possible to get closer to the edge since there was no peel-back zone in FIG. 8B. The Cu-Mo back contact film layer is about 0.6 microns in thickness (the range is about 0.25–1.5μ), while the CIS layer is about 1.0μ in thickness (the range is about 0.8–3μ).

EXAMPLES 3, 4 AND 5

Adhesion Failure Tests

Tape adhesion tests were carried out for CIS films on pure Mo layers deposited on Corning 7059 and soda-lime glass (Examples 3 and 4), and as compared to Cu-Mo layers (Example 5) on soda-lime glass. FIG. 9 shows the test set up. Three 1"×1" glass substrates, 2, were coated with Mo, 4, and Cu-Mo, 3, films, respectively, and then CIS semiconductor films deposited thereon by the process described above and Example 6. A piece of ¾" wide clear scotch tape 120 was overlain on each of the test substrates with the tape projecting on all sides to check resistance to peel-from-edge. The overlap of the tape was approximately 7/16" to ½" deep by 1" wide which defines the potential delamination area 125. That is, half of the coated substrate was exposed and half contacted by the tape. The tape was rubbed moderately several times with the tips of the fingers, and then pulled off immediately.

The CIS films of Example 3, Mo on Corning 7059, and Example 4, Mo on soda-lime glass, adhered very poorly to the respective back contact layers, instead preferentially adhering to the tape. But the CIS layer on the Cu-Mo back contact film of Example 5 (this invention) did not adhere to the tape. To obtain the photos of FIG. 10, the tapes, after being pulled off the test specimens, were adhered to a transparent view graph (mylar) sheet and placed onto a translucent white background and photographed.

FIG. 10A is the result of the adhesion test of Example 3, Mo on Corning 7059, and FIG. 10B is Example 4, Mo on soda-lime glass. The dark area is the CIS film that delaminated and adhered to the sticky tape. The white is the white translucent light box surface showing through the tape. The width of FIG. 10A is 1" indicating complete failure of the CIS to adhere to the Mo film across the entire 1" width of the specimen substrate in the delamination area 125. FIG. 10B, albeit marginally better, shows CIS-to-Mo adhesion failure across approximately 70–80% of the specimen delamination area 125.

FIG. 10C shows essentially no adhesion failure of the CIS to the Example 5 Cu-Mo back contact film layer of the invention. This is unexpected and remarkable in that FIG. 10C is a photo of a second tape applied to a CIS on Cu-Mo film of this invention. The first tape (not shown in FIG. 10) had no dark CIS film liftoff. The application of a second, fresh adhesive tape is shown in FIG. 10C. It exhibits negligible (<1%) lift-off, i.e. negligible, failure of the CIS to adhere to the underlying Cu-Mo back contact layer.

These results show virtually complete failure of the interface adhesion for pure Mo metallizations on both the Corning 7059 and soda lime substrates on the first tape applied. CIS films deposited on Cu-Mo layers on soda lime glass exhibited only extremely minor failures around the edges of the metallization after two tape applications. Adhesion failures in completed solar cell device structures were similarly reduced.

SEM photos comparing typical pure Mo and Cu-Mo films are attached as FIGS. 5–8 (discussed above). Simultaneous composition analyses conducted by EDX are presented in the table above. The films showed a more angular microstructure in the Cu-Mo case. While the gross microstructure of the films may have partially contributed to improved adhesion, it is unlikely that this was the dominant effect. There was no evidence for large Cu phase regions (microchannels) in the deposited layers, and the microstructure of the metallization is typical of deposited Mo layers.

It is important in preparing semiconductor layers to avoid massive leaching of the Cu from the back contact layer which would cause an increase in the Cu content of the deposited semiconductor layer. It is essential to maintain an In-rich composition to produce useful devices. Device layers deposited on Cu/Ga-Mo and Mo metallizations under identical conditions showed no detectable change in CIS composition as measured by EDX. This indicates that the Cu in the back contact metallization layer is not present in large regions that would be readily leached from the substrate. Rather the Cu and/or Ga is present in fine microstructure interstitial veins.

EXAMPLE 6

Device Preparation

FIG. 4 shows the overall flowsheet of the process of this invention, including adding a CdS heterojunction material and top contact ZnO layer to create a functioning solar cell. Greater detail may be found in the Rockett, et al. publications incorporated by reference herein. A glass substrate 2 is first cleaned, 50, at room temperature, typically 20°. A Cu-Mo two-phase back contact layer is deposited thereon by co-sputtering, 60, as described above, typically at 25°–30° C. The In-rich CIS layer is then deposited by vapor deposition, 70, with the initial deposition typically at 400° C. starting with a Cu-rich layer followed by Cu of the Cu-Mo layer interdiffusing, 72, into the CIS layer and vice versa, as well as by excess Cu initially present in the deposition flux. The In-rich upper zone, 74, of the CIS layer follows, typically at 400°–500° C. with Cu diffusion continuing from the Cu-Mo back contact interstices to slightly increase the Cu content of the lower zone 30 (FIG. 2). Then one or more heterojunction partner material layer(s) are deposited 80 by solution or vapor deposition at the lowest possible temperature to keep further Cu dissolution at a minimum. An example is a CdS heterojunction layer(s). Finally, a transparent protective top contact layer, 90, such as a ZnO transparent conductor, is deposited, again at the lowest possible temperature.

The hybrid-process CIS depositions were conducted in a 40 cm-diameter, stainless-steel vacuum system. The system includes two 10 cm-diameter, planar magnetrons, one of which is used for Cu and the other for In sputtering, and a Se effusion cell. Substrates are inserted via a load-lock into a holder equipped with a W-filament radiant heater (encapsulated in a quartz tube to prevent degradation by Se) and a mechanical shutter to prevent deposition during magnetron start-up and sputter cleaning. Two quartz-crystal deposition rate monitors are located such that the flux of each metal could be measured independently. Compositions were checked independently by EDX after deposition. Pumping is provided by a turbomolecular pump with a pumping speed of 250 L/s backed by a mechanical pump. The base pressure of the system is $1 \times 10^{-4}$ Pa ($1 \times 10^{-6}$ Torr). Sputtering is carried out in Ar (99.9999% pure) at a pressure ranging from 0.07 to 0.3 Pa (0.5 to 2 mTorr) which is measured with a capacitance manometer. The pressure is adjusted using an automatic mass-flow controller. The high operating pressure of the vacuum system during film growth represents a significant change in the deposition environment compared to three-source evaporation.

Polycrystalline $CuInSe_2$ films were deposited on 25×25× 1.2 mm, Corning type 7059 borosilicate glass substrates which were previously coated with Mo or Cu-Mo by magnetron sputtering. Glass substrate preparation consisted of spraying with a detergent solution followed by a 300 second deionized water rinse and 300 second spin dry cycle in a substrate rinser/dryer.

Microstructural studies were carried out using Phillips 400 and 420 transmission electron microscopes (TEMs), equipped with EDAX energy-dispersive (EDX) microchemical analysis instruments for determination of the composition of individual grains. Analyses were also conducted in a Hitachi scanning electron microscope (SEM) equipped with EDX. EDX analyses were quantified by comparison with standard sample results and with values obtained by Rutherford backscattering spectroscopy (RBS). The random error due to system noise in a given EDX analysis was found to be approximately ±0.5 atomic percent (at. %) and the error in determining the sample composition with respect to a standard was better than ±1 at. % for each element. Errors were reduced significantly by averaging repeated analyses. Depth profiles were obtained by secondary ion mass spectrometry (SIMS) and were compared with RBS data as RBS sensitivity permitted. The SIMS analyses used a Cs primary ion beam and provided a depth resolution of approximately 140 nm per decade of signal change on a relatively smooth surface.

Heterojunction solar cells were produced by evaporation of 1.7 μm of $C_{0.9}Zn_{0.1}S$ with a sheet resistance of 50Ω/ square. This was coated with 180 nm of sputtered ITO and finished with Ni buss bar contacts. The active areas were 0.08 cm².

Adhesion failures typically occur during handling of the semiconductor device (e.g., solar cells) at room temperature or during deposition of any high-stress layers such as the heterojunction partner or transparent top contact material, usually the latter. It is clear from tape test results that stresses cause problems and the Cu/Ga-Mo layer minimizes stresses, we believe due to the ductility of the Cu and/or Ga interstitial micro-veins accommodating and compensating for the Mo stress during deposition. Hence, in addition to improving the adhesion by use of this invention the Cu/Ga-Mo layer minimizes of stress in all layers including over layers and during handling.

EXAMPLE 7

Comparative Photovoltaic Conversion Tests

A pair of solar cell test plates were prepared as in Example 6 on 25 mm ×25 mm×1.2 mm (1"×1") square Corning 7059 glass substrates, one with a Mo back contact layer and one with a Cu-Mo two-phase single layer back contact film of this invention by the process described above in Example 6. The 1"×1" test plates were each etched to provide 12 test cells C1–C12 of 0.08 cm² active area shown in FIG. 12 Each of these cells were tested for performance. The best cell from each of the test plates had the following performance characteristics:

TABLE 2

| Comparative Cell Characteristics | | |
|---|---|---|
| | Back Contact Layer | |
| Parameter | Mo | Cu—Mo |
| V(OC) (mV) | 375 | 426 |
| V(MP) (mV) | 278 | 331 |
| J(SC) (mA/cm²) | 31.4 | 35.3 |
| J(MP) (mA/cm²) | 26.8 | 30.2 |
| Fill Factor (%) | 63.1 | 66.5 |
| Efficiency (%) | 8.5 | 10.0 |

V(OC) is the open circuit voltage at the zero current point on the X axis of the graph in FIG. 11. V(MP) is the maximum power point. J(SC) is the short circuit (zero voltage) current density plotted on the Y axis of FIG. 11. J(MP) is the current density at maximum power (voltage). The Fill Factor is a percentage of the theoretical power output which equals maximum voltage, V(MP), times maximum current density, J(MP), divided by short circuit current density, J(SC), times open current voltage, V(OC). The test cell set up is shown in FIG. 13, wherein the films are etched off the substrate to form a multi-layer cell 130 on the surface 7 of the substrate 2. Layer 3, 4 is either Mo or Cu/Ga-Mo, layer 15 is the CIS semiconductor, layer 80 is the heterojunction layer, layer 90 is the overlayer, and 135, 140 are the Ni buses for leads to determine current and voltage when placed under the standard light source. All active devices were tested at IEC under an 87.5 mW cm⁻² simulated solar spectrum. The results were then normalized to 100 mW cm⁻² flux values.

Both the current and voltage outputs increased in the cell of this invention, as well as a substantial increase in the fill factor from 63.1% to 66.5%. Surprisingly, the conversion efficiency increased by a very substantial 17.6% (1.5÷8.5) to a full 10% efficiency. The increase in voltage and current are believed to be strong evidence for fewer failures leading to shunts from the front to the back contact. FIG. 11 graphically illustrates the current density vs. voltage curves of both the Mo cell and Cu-Mo, and the improved performance of the Cu-Mo cell as compared to the Mo cell. The Fill Factor curve of the Cu-Mo film is clearly improved as compared to the Mo cell.

EXAMPLE 8

Comparative Uniformity

The two test plates of Example 7 were sampled at the 12 test solar cells, C1–C12 for uniformity in output across the face. FIG. 12 illustrates the comparative uniformity of the cells across the test plates, the density chart (grey scale) on the right being normalized to the best cell; that is, the percentages are the percentage of output as compared to the best cell in the array of 12 cells on the test plate substrate. For example, <15% means less than 15% of the output of the best cell, which <15% corresponds to a dead cell acting as a resistor, not a diode. FIG. 12A, the Mo test plate, has two cells below 15% of standard output (dead), two areas of 15–29% of standard output, two areas in the 30–44% range, 3 areas in the 45–69% range, 1 in the 70–84%, 1 in the 85–99% and 1 in the 100% range (best cell). In contrast, the Cu-Mo film test plate shows no dead cells (none less than 15%), none in the 15–29% range, one in the 30–44% range, two in the 45–69% range, 8 in the 85–99% range and 1 in the 100% range. The weighted average output for the Cu-Mo is far higher than the Mo-only and shows strikingly greater uniformity of cells across the test substrate.

The reduction in failure rate means there is less sensitivity to position on the sample. Typically there is only about a 2% variation in the composition across the test plate substrate. But the performance variations here are so different that we conclude the In-rich CIS has delaminated, or at best poorly adhered to the Mo. The poor performance of the Mo as compared to the Cu/Ga-Mo is due to adhesion differences, not compositional differences. Ordinarily as In content increases, which is necessary for a good device, failure rate increases. This is offset by use of Cu-Mo films of this invention, that is, by use of the Cu/Ga-Mo back contact films of this invention. The In content can be increased without degradation in performance by use of the Cu/Ga-Mo films of this invention.

It should be understood that various modifications within the scope of this invention can be made by one of ordinary skill in the art without departing from the spirit thereof. We therefore wish our invention to be defined by the scope of the appended claims as broadly as the prior art will permit, and in view of the specification if need be.

We claim:

1. A prepared substrate assembly for semiconductor film devices comprising in operative combination:
   a) a substrate member for supporting a semiconductor film;
   b) a single layer back contact film deposited on said substrate for bonding said semiconductor film to said substrate support member;
   c) said single layer back contact film comprising a multi-phasic M-Mo film, wherein M is a metal selected from the group consisting essentially of Cu, Ga and mixtures thereof, said film layer having a substantially columnar microstructure with M-filled microchannels at least partially penetrating said film layer to provide regions which are substantially pure Mo and interstitial microchannels of substantially pure ductile M-metal;
   d) said Mo is substantially inert to constituents of said semiconductor film, and said ductile microchannels of M-metal reduce residual stress in the back contact film layer and provide good ohmic contact; and
   e) said M-metal in said microchannels is partially leachable upon semiconductor layer deposition, and a portion thereof becomes incorporated in said semiconductor layer to provide good mechanical adhesion of said semiconductor layer to said back contact film layer, thereby reducing delamination and improving efficiency and fill factor characteristics of active solar cell layers deposited thereon.

2. A prepared substrate assembly as in claim 1 wherein:
   a) said back contact layer has a thickness in the range of from about 0.25 to about 10 microns;
   b) said M-metal is present in said film layer in the range of from about 15 to about 50 atom percent; and
   c) said substrate includes an $SiO_2$-containing material, an $Al_2O_3$-containing material, and mixtures thereto.

3. A prepared substrate assembly as in claim 2 wherein:
   a) said M-metal is present in said film in the range of from about 25 to about 35 percent.

4. A prepared substrate assembly as in claim 3 wherein: said M-metal is Cu.

5. A semiconductor film device comprising:
   a) a substrate member for supporting a semiconductor film;
   b) a single layer back contact film deposited on said substrate for bonding said semiconductor film to said substrate support member;
   c) said single layer back contact film comprising a multi-phasic M-Mo film, wherein M is a metal selected from the group consisting essentially of Cu, Ga and mixtures thereof, said film layer having a substantially columnar microstructure with M-filled microchannels at least partially penetrating said film layer to provide regions which are substantially pure Mo and interstitial microchannels of substantially pure ductile M-metal;
   d) said Mo is substantially inert to constituents of said semiconductor film, and said ductile microchannels of M-metal reduce residual stress in the back contact film layer and provide good ohmic contact;
   e) said M-metal in said microchannels is partially leachable upon semiconductor deposition, and a portion thereof becomes incorporated in said semiconductor layer to provide good mechanical adhesion of said semiconductor layer to said back contact film layer, thereby reducing delamination and improving efficiency and fill factor characteristics of active solar cell layers deposited thereon; and
   f) at least one semiconductor film deposited upon said back contact layer.

6. A semiconductor film device as in claim 5 wherein:
   a) said semiconductor film is a Cu-type semiconductor film.

7. A semiconductor film device as in claim 6 wherein:
   a) said Cu-type semiconductor film is a $CuXSe_2$ semiconductor film where X is selected from the group consisting essentially of In, Ga, and mixtures thereof.

8. A semiconductor film device as in claim 7 wherein:
   a) said $CuXSe_2$ semiconductor film is Cu-rich adjacent the interface thereof with said back contact layer, and In-rich adjacent the semiconductor film outer surface.

9. A semiconductor film device as in claim 8 wherein:
   a) X is a mixture of Cu and Ga.

10. A semiconductor film device as in claim 5 wherein:
    a) said back contact layer has a thickness in the range of from about 0.25 microns to about 10 microns;
    b) said M-metal is Cu and is present in said film layer in the range of from about 25 percent to about 35 percent; and
    c) said substrate includes an $SiO_2$-containing material, an $Al_2O_3$-containing material, and mixtures thereof.

11. A semiconductor film device as in claim 10 wherein:
    a) said semiconductor film is a $CuXSe_2$ semiconductor film where X is selected from the group consisting essentially of In, Ga, and mixtures thereof.

* * * * *